United States Patent [19]

Lee

[11] Patent Number: 5,327,317

[45] Date of Patent: Jul. 5, 1994

[54] SELF-TERMINATING DATA LINE DRIVER

[75] Inventor: Terry R. Lee, Boise, Id.

[73] Assignee: Micron Technology, Inc., Boise, Id.

[21] Appl. No.: 806,688

[22] Filed: Dec. 13, 1991

[51] Int. Cl.[5] .............................................. G11C 7/00
[52] U.S. Cl. ...................................... 361/88; 361/90; 361/91
[58] Field of Search ............................ 361/88, 91, 90; 307/448, 443, 263, 473

[56] References Cited

U.S. PATENT DOCUMENTS 5,043,944  8/1991  Nakamura ........................... 307/473

Primary Examiner—A. D. Pellinen
Assistant Examiner—S. Jackson
Attorney, Agent, or Firm—Susan B. Collier

[57] ABSTRACT

The invention is a self-terminating helper flip-flop buffer circuit pertinent to a dynamic random access memory (DRAM) or static random access memory (SRAM) device. The invention turns off a device which is sourcing current to pull the data line low. The device is turned off when the potential on the low data line has transitioned to the trip point of the output data latch. The circuit of the invention senses the transition and provides the self terminating signal to the current source.

11 Claims, 7 Drawing Sheets

SELF-TERMINATING DATA LINE DRIVER

FIELD OF THE INVENTION

The invention relates to dynamic random access memory (DRAM) and static random access memory (SRAM) circuit technology for routing the memory cell information from the memory array to the output logic and output drivers at the periphery of the chip.

BACKGROUND OF THE INVENTION

High density dynamic random access memorys (DRAMs) and static random access memorys (SRAMs) have long data lines for routing the memory cell information from the memory array to the output logic and output drivers at the periphery of the chip. These long data lines have large parasitic capacitances which limit the maximum operating frequency of the device. One method of improving the speed of the device is to reduce the length of the data lines by subdividing the memory array into smaller sections. However, this method is not always practical due to limitations in die size, packaging constraints, and other architectural layout limitations.

Many techniques have been employed for sensing the differential signal developed on the DRAM digit lines, amplifying the signal, and transmitting it to the output buffers. One method commonly used in DRAMs is to sense the signal with n and p-channel sense amplifiers, drive this differential potential to the end of the array, and amplify the differential potential with DC sense amplifiers located at the end of the array. The output of the DC sense amplifiers are used to drive the output logic located in the chip periphery.

With this approach the data lines develop a differential potential relatively slowly due to the low drive of the sense amp and the large RC time constant of the digit line, I/O line and data line combination. Specifically, the n and p-channel sense amplifiers are designed to have low drive capability in order to reduce power dissipation, since as many as 256 sense amps are turned on at once (the entire row). These sense amps drive the data lines through a column decode transistors 1 and an I/O line-to-data line multiplexer transistors 5, see FIG. 1. These transistors 5 have a drain-to-source resistance which increases the RC time constant of the circuit. Further, the capacitive load of the I/O lines 10 and data lines 11 combination is relatively large due to the number of column decode transistors 1 connected to the I/O lines 10, and due to the long lengths of data lines 11.

Another approach that is used in sensing the potential of the I/O lines is the addition of a helper flip-flop. With a helper flip-flop, the I/O lines are allowed to develop sufficient differential potential prior to clocking the flip-flop with an enable signal. While enabled, the helper flip-flop uses positive feedback to pull the true and complement output signals towards opposite supply potentials, thus amplifying the input signal. The large level differential output potential can be used to drive the input of a buffer circuit for driving the large capacitive load of the data lines. Sometimes, an additional helper flip-flop is used at the end of the data lines.

The advantage of a helper flip-flop is that the data lines are buffered from the I/O and digit lines, and a lower output impedance buffer circuit is used to drive the capacitive data lines. The disadvantage of this approach is that adequate signal must be developed prior to clocking the flip-flop to ensure that the output transitions to the correct state. Thus, the flip-flop must be clocked each time a new memory bit is accessed.

With either architecture, DC sense amp or helper flip-flop, the I/O and data lines are equilibrated and precharged to some operating point prior to turning on the column decoder gate and transferring the digit line differential potential. This is done to improve the speed, because the I/O and data lines now transition from midpoint to new state instead of from old state to new state. With a DC sense amp, the I/O and data lines are precharged to a potential compatible with the quiescent operating point of the amplifier, usually on the order of 0.6 $V_{cc}$. With the helper flip-flop the I/O and data lines are usually precharged to $V_{cc}$, and the output changes state when one of the data lines (true or complement) transitions to the opposite state, ground in this case.

With the helper flip-flop some speed is lost and some power is dissipated in each access cycle, since the data line transitions from $V_{cc}$ to ground and is precharged back to $V_{cc}$ prior to transitioning back to ground. Since the data lines have a large capacitive load, it takes significant time for the lines to transition between each power supply level. Also, power is dissipated in precharging and discharging the capacitances.

The output of the helper flip-flop usually drives a data latch which is used to store the data result while the data lines precharged. The latch 15 is shown in FIG. 2. The latch is constructed in a manner such that the latch holds the previous data when the data lines are both high, and the latch is set or reset when one of the data lines transitions low. The input of the latch can be designed to have a high trip point to improve and reduce the time required to transition to a new state.

FIG. 3 shows the schematic of a helper flip-flop buffer circuit. Transistors 20 and 25 comprise the cross-coupled differential transistor pair and transistor 30 is the current source for the helper flip-flop 35. The helper flip-flop 35 is clocked by a strobing signal, ENNSA, available at terminal 40. Transistors 45, 50, and 55 are used to precharge and equilibrate the helper flip-flop 35 to $V_{cc}$. Transistors 60 and 65 are pass devices used to isolate the I/O lines 70 from the flip-flop 35 just prior to strobing the flip-flop 35. Transistors 75, 80, and 85 are used to precharge and equilibrate the data lines 90 and 95 to $V_{cc}$. The buffer section 96 comprises differential pair transistors 100 and 105 and comprises the current source transistor 110. Capacitors 115 and 120 have been used to model the data line parasitic capacitance load.

FIG. 4 shows a typical timing sequence for the schematic of FIG. 3. The I/O lines 70 have been initially precharged to $V_{cc}$ (5v) by an I/O line precharge circuit not shown. During the precharge time the helper flip-flop internal nodes 111 and 112 and data lines 90 and 95 are precharged to $V_{cc}$ by a low CEQ* signal at terminal 113; the flip-flop and buffer section 96 is turned off since the signal at the ENNSA terminal 40 is low. At this time, the helper flip-flop 35 is also isolated from the I/O lines 70 by a high HFFISO* signal at terminal 114.

Differential potential is allowed to develop on the I/O lines at the start of an access cycle. At this time the equilibration is released (CEQ* goes high) and the helper flip-flop is connected to the I/O lines through the pass devices 60 and 65 (HFFISO* goes low). A small differential potential then develops on the helper flip-flop internal nodes 111 and 112. The potentials on internal nodes 111 and 112 are referred to as HFF and HFF* respectively. After sufficient potential has developed, the helper flip-flop 35 is isolated from the I/O lines (HFFISO* goes high) and ENNSA goes high which enables the buffer section 96. The internal flip-flop nodes 111 and 112 rapidly separate in potential due to the positive feedback of the helper flip-flop 35. These signals then drive the buffer section 96 which causes one of data lines 90 and 95 to be pulled to a low state, in this case complimentary data line (DL*) 95. After the data line has reached its ground potential, the helper circuit flip-flop 35 can be disabled (ENNSA goes low), and I/O lines 70 and data lines 90 and 95 can be precharged for the next access cycle. In the figure, data line (DL) 90 starts to momentarily go low by 1.5 volts; however, this is due to the equilibrate device. After sufficient precharge time, both data lines 90 and 95 will return to $V_{cc}$.

The speed of an access cycle can be improved in a helper flip-flop design by only allowing the data lines to transition to a predetermined margin past the trip point of the data latch, as opposed to transitioning all the way to ground. Cycle time is improved because the data lines take less time to precharge from this level. A data line clamping circuit can be used for this purpose; however, power is dissipated in the clamping circuit.

FIG. 5 shows the same schematic as FIG. 3 with diode clamps 200 and 205 added to the data lines to limit their potential swing. The clamps can be sized appropriately to clamp the potential at the desired level. FIG. 6 shows the timing for this circuit which is identical to FIG. 2 except for the data line potentials. Note that the potential of complimentary data line 95 only reaches 2.5v due to the clamps, and therefore precharges back to $V_{cc}$ faster. If we assume that the trip point of the output latch is at 3v, then the output latch will switch later than in the previous circuit. This is due to the exponential transition of the data line, where the data line now exponentially approaches 2.5v instead of 0v. This is because the pull-down drive current of transistor 100 or 105 is opposed by the clamping pull-up current of transistor 200 or 205, respectively. In this case since the trip point is closer to the exponential final value, it takes longer for complimentary data line to reach the trip point potential. Further, more power is dissipated in this circuit since a DC current path exists from Vcc to ground via transistors 200, 100, and 110 or transistors 205, 105, and 110.

What would be most desireable is to have a signal that approaches ground at the same rate as in the circuit of FIG. 1, but stops abruptly, not exponentially, at some intermediate potential level. Further, it is desired to achieve this signal waveform without introducing more power dissipation as in the circuit of FIG. 5 comprising the diode clamps. The described invention accomplishes these goals, and thereby improves on the prior art.

SUMMARY OF THE INVENTION

The invention is a self-terminating helper flip-flop buffer circuit pertinent to a dynamic random access memory (DRAM) or static random access memory (SRAM) device. The invention turns off a device which is sourcing current to pull the data line low. The device is turned off when the potential on the low data line has transitioned to the trip point of the output data latch. The circuit of the invention senses the transition and provides the self terminating signal to the current source.

This invention improves upon prior art by limiting the voltage swing to an intermediate potential of the data lines without dissipating power in a clamping circuit. This invention eliminates the clamp circuit, dissipates less power in switching the data lines between logic states, and reduces both the precharge time and access time. This has been accomplished with pertinent changes only to the buffer section of the helper flip-flop, although a latch has been incorporated in the helper flip-flop section. Therefore, it is applicable to other circuits where a buffer is used and the outputs are precharged to a common high or low logic level.

DETAILED DESCRIPTION OF THE PREFERRED EMBODIMENT

Figure 1:
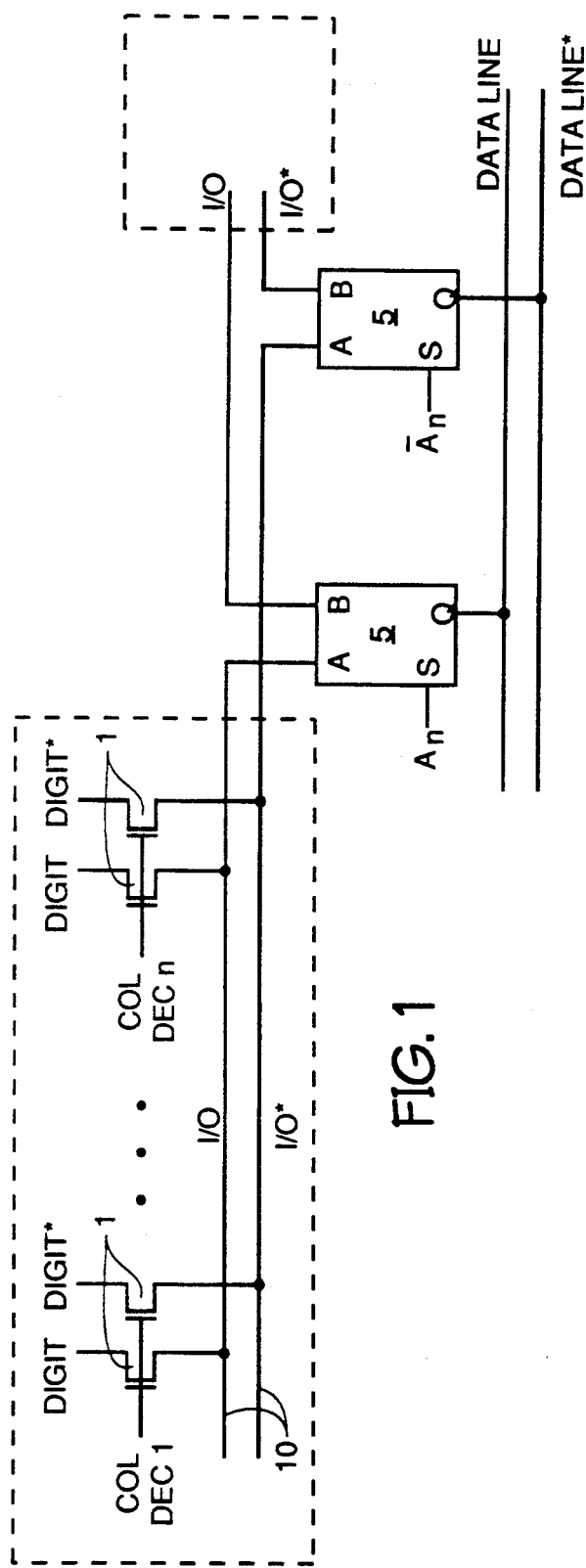
FIG. 1 is a portion of a dynamic random access memory (DRAM) circuit exemplifying the I/O lines, data lines, column decode transistors, and I/O line-to-data line multiplexers.
Figure 2:
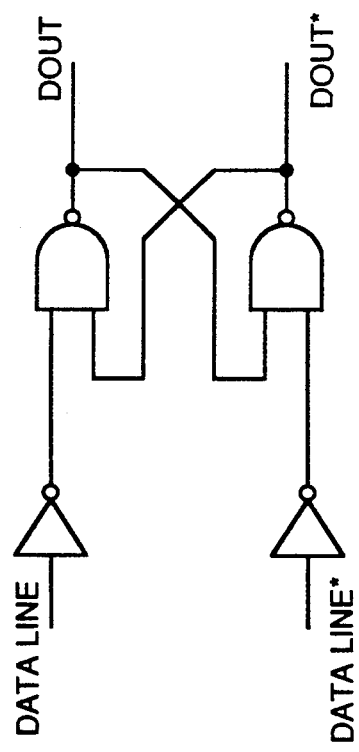
FIG. 2 is a data latch circuit typically driven by a helper flip-flop in a DRAM circuit.
Figure 3:
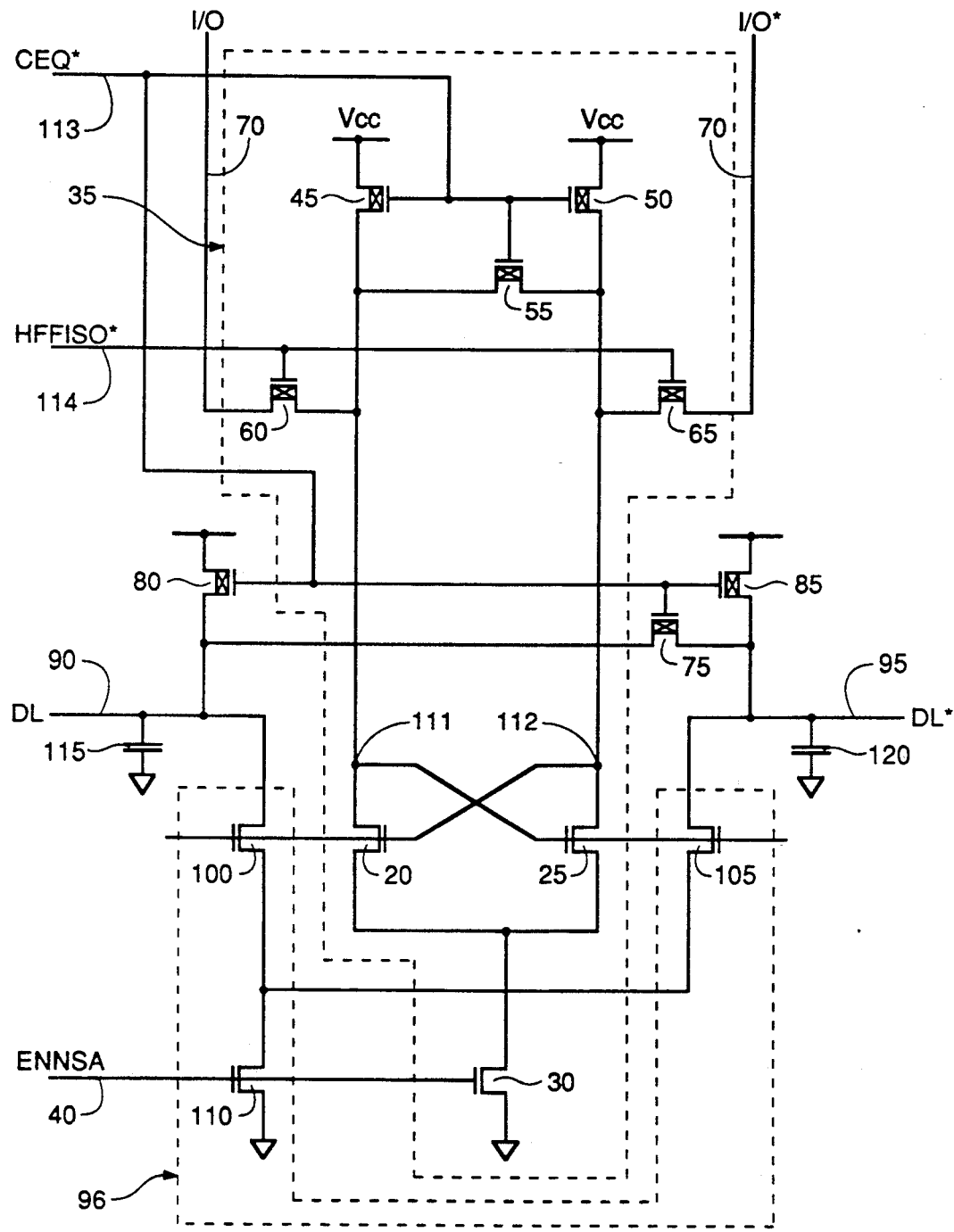
FIG. 3 is the schematic of a helper flip-flop buffer circuit of the prior art.
Figure 7:
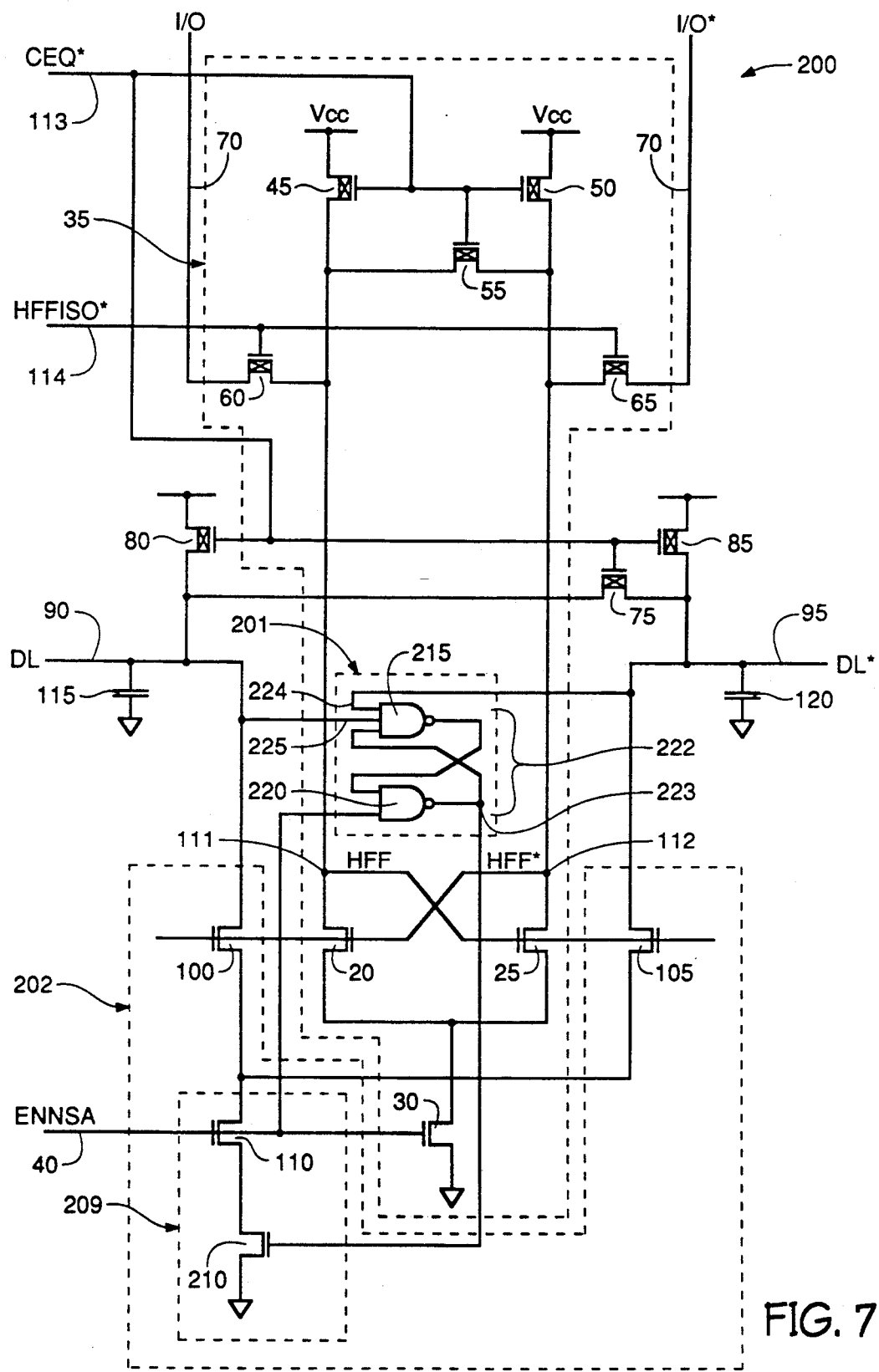
FIG. 7 is the schematic of the self-terminating helper flip-flop buffer circuit of the preferred embodiment of the invention.

FIG. 7 shows the schematic of the self-terminating helper flip-flop/buffer circuit 200 of the preferred embodiment. The self-terminating helper-flip/flop buffer circuit 200 comprises a helper flip/flop section 35 identical to the helper-flip-flop section of FIG. 3, with the exception of a control latch portion 201. The control latch portion 201 is instrumental in providing a self-terminating signal to a buffer section 202 in response to a low potential on either one of the data lines, 90 or 95. The buffer section 202 includes a current source 209. The current source 209 comprises a terminating transistor 210 serially connected to a current source transistor 110.

NAND gates 215 and 220 are cross-coupled to form control latch 201. Data line 90 and complimentary data line (DL*) 95 are inputs to NAND gate 215 and when one of the data lines 90 and 95 has transitioned lower than the trip point of the NAND gate 215, the control latch 201 has a low output signal at output node 223. The low output signal turns off the transistor 210 which is sourcing the current to pull the pertinent data line low. When transistor 210 is turned off the potential on the data line that was transitioning low is retained by the large parasitic capacitance of the data lines 90 and 95. The trip point is an intermediate potential at a higher potential than the potential driven to the data line by the prior art buffer. Since the data line is not pulled as low as the prior art, response time and power consumption are improved over the prior art.

The circuit can be better understood by the following analysis of the circuit with respect to the circuit inputs and the potentials generated throughout the circuit.

Figure 8:
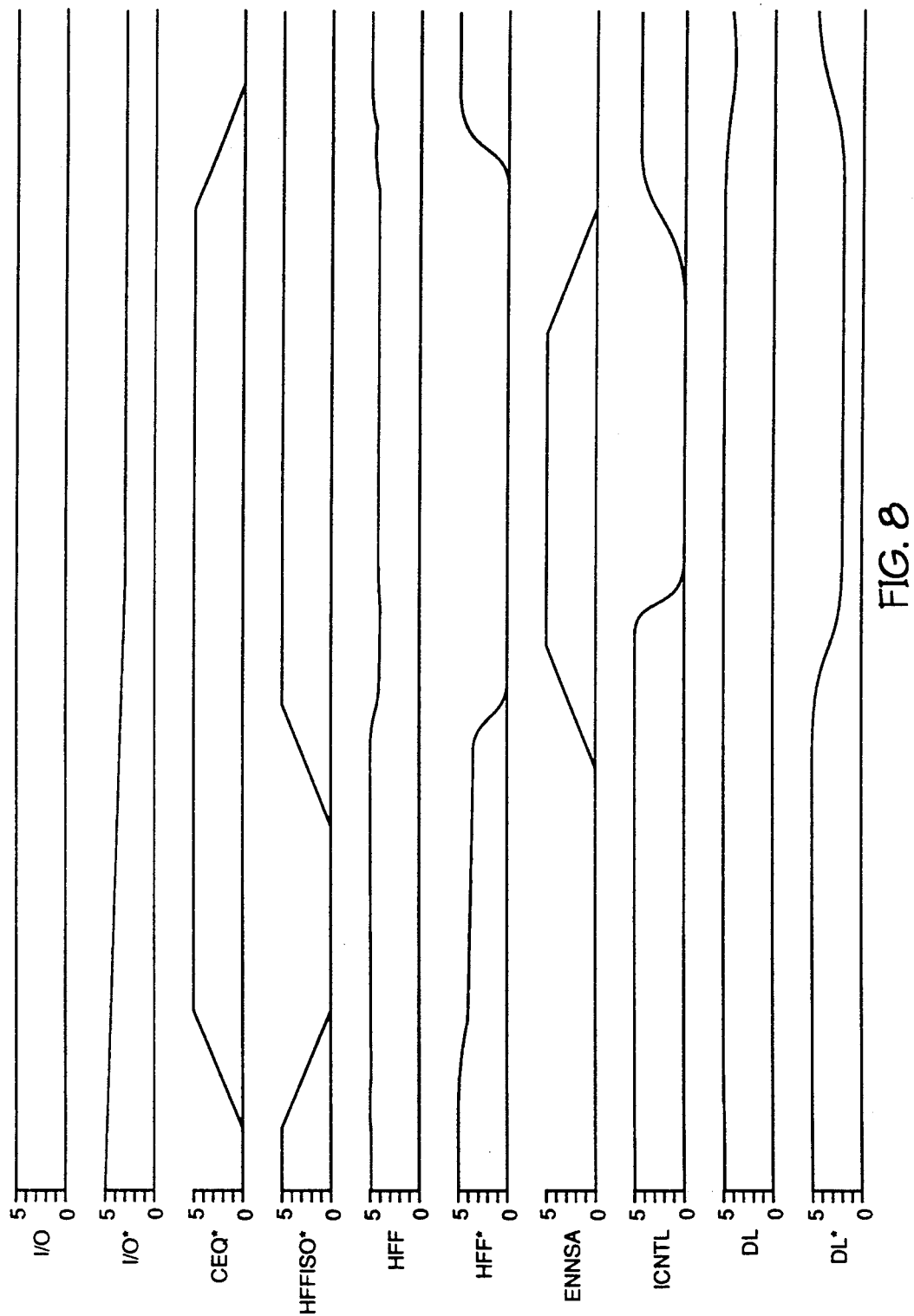
FIG. 8 is a typical timing sequence for the schematic shown in FIG. 7.

FIG. 8 shows the timing sequence of the pertinent potentials, and when studied with respect to the circuit of FIG. 7 the circuit functions are readily understandable. The circuit functions are sectionalized below to provide a sequential understanding of the timing sequence of FIG. 8.

during precharge, the I/O lines 70 are precharged to a $V_{cc}$ 5 volts and are isolated from the helper flip flop 35 by deactuated transistors 60 and 65, HFFISO* is high. The I/O line precharge circuitry is not shown. The data lines 90 and 95 are precharged to a high potential through transistors 80, 85 and 75, and HFF 111 and HFF* 112 are precharged to a high potential through transistors 45, 50 and 55, CEQ* is low. This condition sets the control latch output signal to a high potential at output node 223 when ENNSA is also at a low potential. The high control latch output signal enables terminating transistor 210. However current source transistor 110 and the helper flip flop 35 are disabled by a low potential on ENNSA, and no current flows through terminating transistor 210.

After the circuit has been precharged it is enabled to sense the differential potentials on the I/O lines 70 and drive the differential potentials to the data lines 90 and 95. CEQ* goes to a high potential to release the HFF 111 and HFF* 112 and the data lines 90 and 95 from the 5 volt precharge potential. The I/O lines 70 are also released from the precharge potential. When a sufficient differential potential is developed on the I/O lines, HFFISO* goes to a low potential activating transistors 60 and 65, and the differential potential on the I/O lines 70 is felt at HFF and 111 and HFF* 112. HFFISO* returns to a high potential to isolate HFF 111 and HFF* 112 from the I/O lines 70. ENNSA then goes to a high potential enabling the helper flip flop 35 thereby effecting a quick separation of the potentials at HFF 111 and HFF* 112 due to the positive feedback of cross coupled transistors 20 and 25 and the low parasitic capacitance present on nodes HFF 111 and HFF* 112. HFF 111 and HFF* 112 are at opposite logic states, and whichever is at a high logic state actuates the corresponding differential transistor. A high potential on HFF 111 actuating transistor 105, and a high potential on HFF* actuating transistor 100. In the present example, HFF 111 is at a high potential and HFF* 112 is at a low potential. Therefore differential transistor 105 is actuated and differential transistor 100 is deactuated. The high potential initially developed on data line 90 during precharge is isolated by deactuated differential transistor 100 and data line 90 is pulled high through a weak pull-up transistor (not shown). The high potential initially on the complementary data line is discharged to ground through actuated differential transistor 105, current source transistor 110 and terminating transistor 210. Thus, the differential potentials on the I/O lines 70 have been sensed and driven the respective data lines 90 and 95.

The self-terminating feature of the invention terminates the driving of the differential potential of the I/O lines 70 to the data lines 90 and 95. When one of the data lines transitions to a sufficiently low potential the control latch output signal at output node 223 goes to a low potential deactuating terminating transistor 210, thereby interrupting the current path to the low potential data line from the reference potential. In the present example a low is felt at NAND gate input terminal 224, 223 goes to a low potential and terminating transistor 210 is deactuated. Complementary data line 95 goes to a high impedance state and the low potential is maintained by the parasitic capacitance of the complementary data line until the initiation of precharge for the next cycle.

Figure 4:
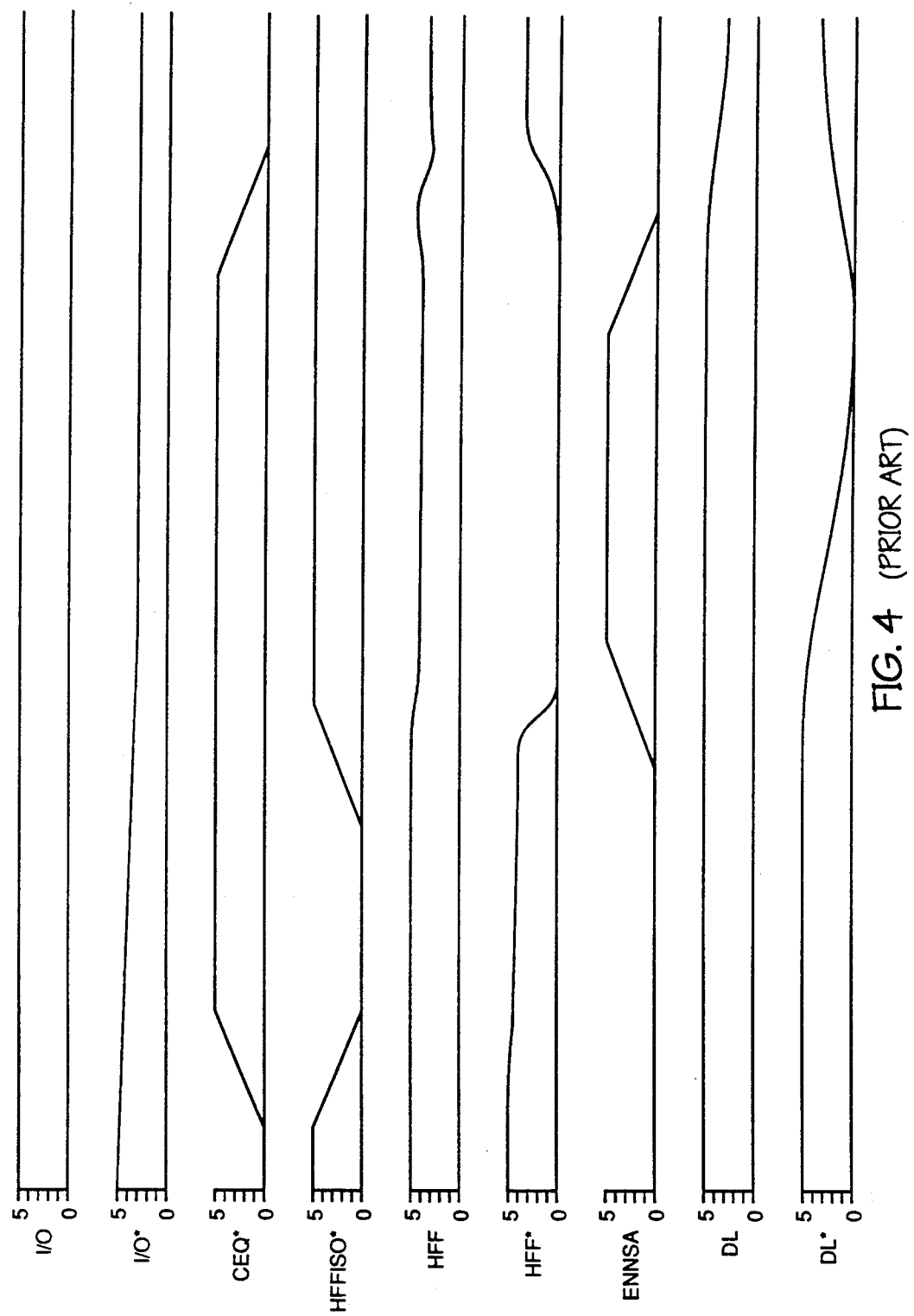
FIG. 4 is a typical timing sequence for the schematic shown in FIG. 3.
Figure 5:
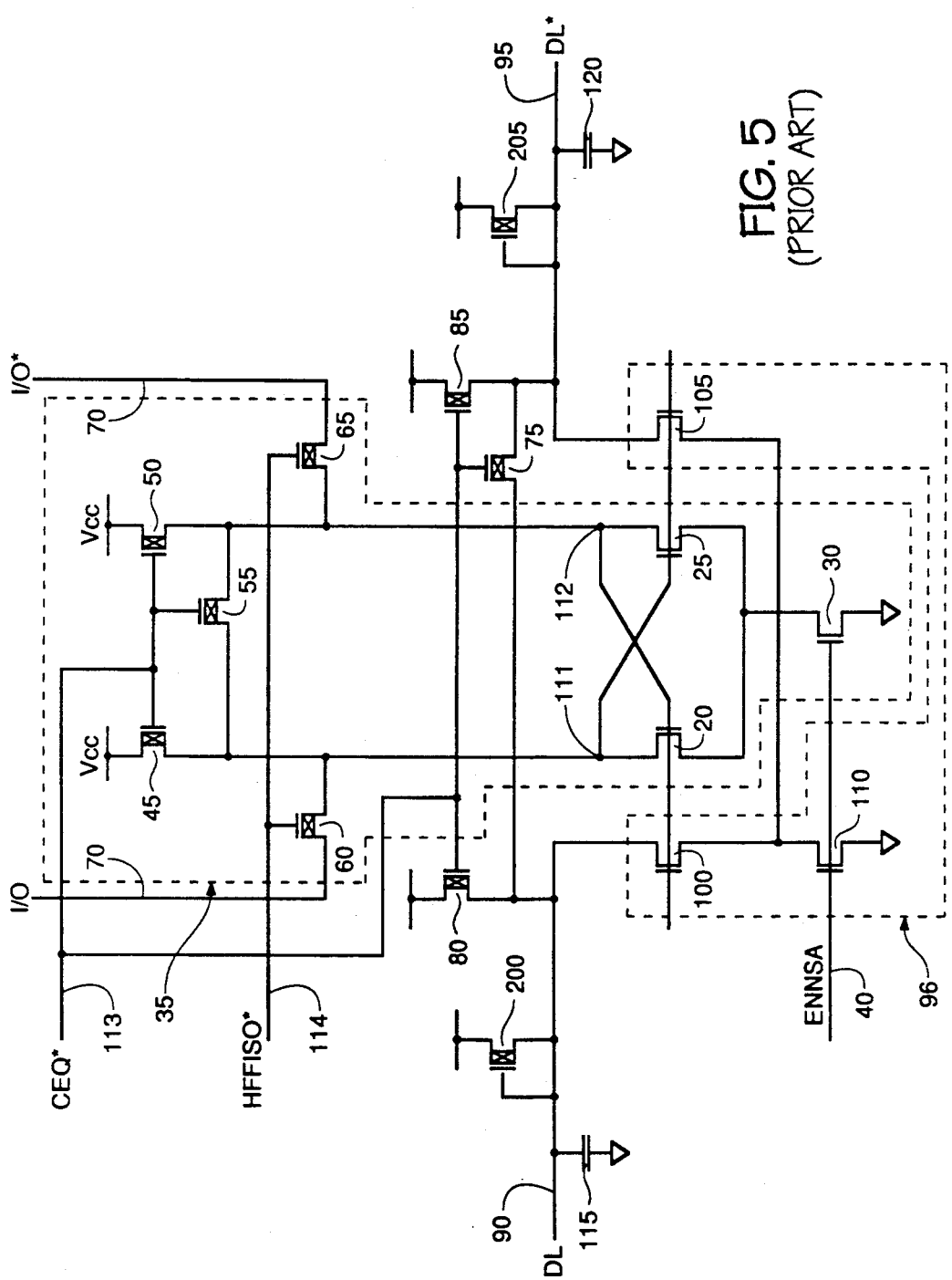
FIG. 5 is the schematic of FIG. 3 with the addition of diode clamps.
Figure 6:
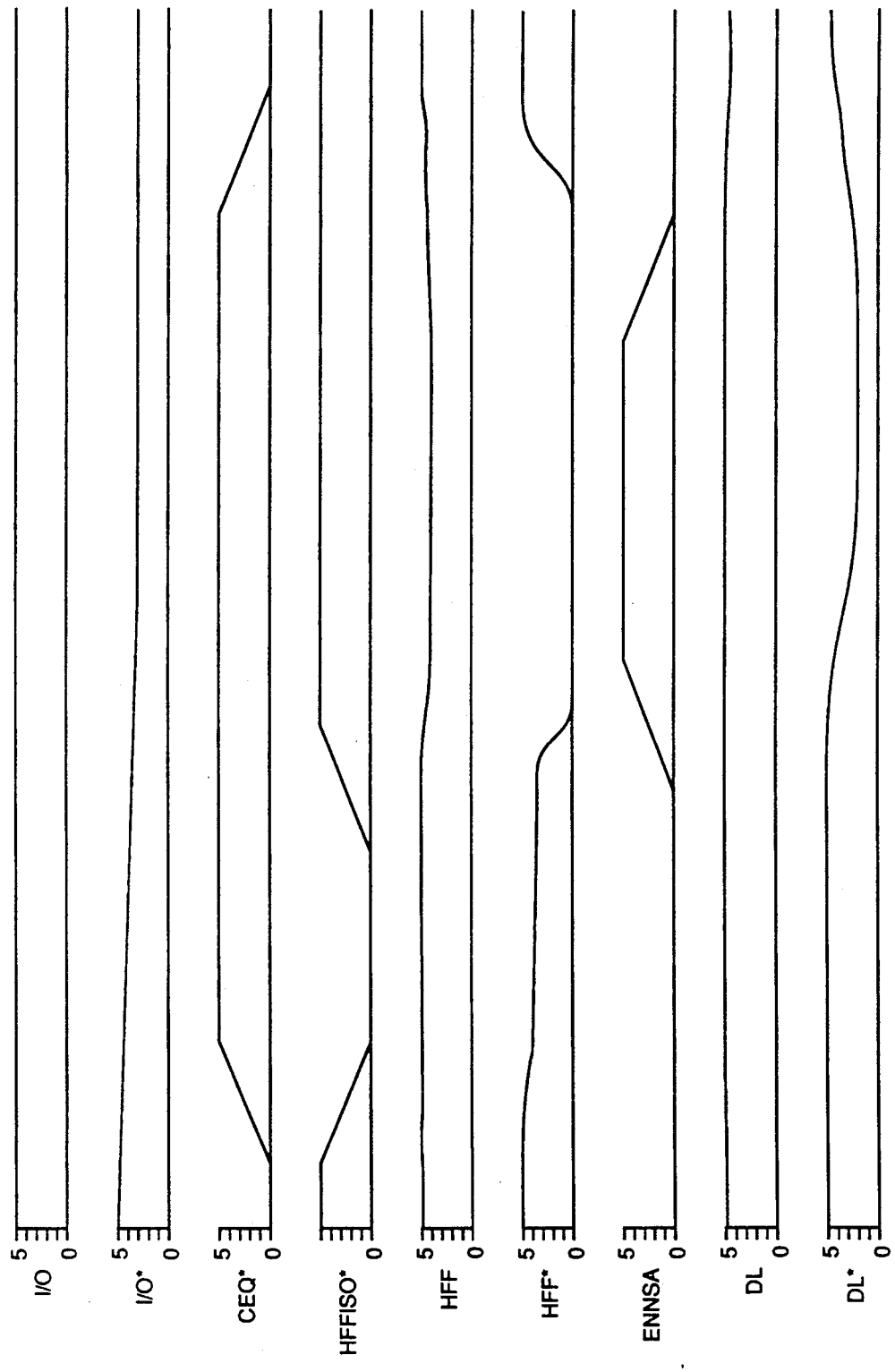
FIG. 6 is a typical timing sequence for the schematic shown in FIG. 5.

Note that complimentary data line transitions low at the same rate as in FIG. 4, the timing sequence for the original buffer circuit. However, once the designed trip point is reached, the current source abruptly turns off (ICNTL), the potential at node 223, goes low), and the complementary data line goes to a high impedance state where the potential is maintained by the capacitance of the data line. Further, it is possible to shape the waveform of the data line turning off, by appropriate sizing of NAND gate 220. That is, 220 can be designed to have a fast output fall time for an abrupt turn off, or a slow output fall time for a smooth turn off.

The trip point of NAND gate 215 can be set to be the same or lower than the output data latch trip point. Further, in order to optimize performance the gate can be designed to have a different trip point for data lines 90 and 95 than the latch feedback signal at output node 223.

With this invention, the output transitions rapidly as in the original circuit, but can be precharged faster as in the original circuit with diode clamps. However, no power is dissipated in the clamping device. Also, the inventive circuit dissipates less power in transitioning the data lines than the original circuit. This is due to the fact that the large parasitic capacitance of these lines are undergoing smaller potential changes. To illustrate this point, assume that $V_{cc}=5V$ and the data line turns off at 2V. The power in switching the data line low and high in the original circuit is $cv^2f$, where c is the data line capacitance, v is the potential change, and f is the frequency of the circuit (the reciprocal of the access cycle time). Since the potential is transitioning between $V_{cc}$ and ground, then the power dissipation in the original circuit is 25cf. In this invention, the data line is transitioning between 5V and 2V, so v=3V in the equation. The power dissipated in the new circuit is 9cf. Thus, this circuit uses approximately 9/25 of the original power. Although this calculation neglects the power dissipated in the NAND latch, this loss is negligible since the output capacitances of the NAND latch are minimal. Therefore, this circuit allows for faster cycle times and lower power dissipation.

While the invention is applicable to a helper flip-flop in a memory device, it is not limited to this purpose. The buffer section is particularly viable for many applications.

Many different circuit implementations can be used for this invention, and the actual implementation is not critical to the concept. Thus, it will be apparent to those skilled in the art that the disclosed invention may be modified in numerous ways and may assume many embodiments other than those specifically set out and described above. Accordingly, it is intended by the appended claims to cover all modifications to the invention which fall within the true spirit and scope of the invention.

I claim:

1. An electronic device for driving differential potentials to first and second data lines, comprising:
   a) a first node connectable to a first potential;
   b) a second node;
   c) a gating device electrically interposed between said first node and said second node;

d) a first switching device interposed between said first data line and said second node;

e) a second switching device interposed between said second data line and said second node, said first data line capable of being pulled toward said first potential when said first switching device is actuated, and said second data line capable of being pulled toward said first potential when said second switching device is actuated; and f) a differential signal sensing circuit for sensing said differential potentials on said first and second data lines, said first and second data lines in electrical communication with first and second input terminals, respectively, of said differential signal sensing circuit, said differential signal sensing circuit having an output terminal, a control input of said gating device in electrical communication with said output terminal of said signal sensing circuit, said gating device having first and second switching states controlled by an output signal from said differential signal sensing circuit, said output signal available at said output terminal, wherein said differential potentials can be driven to said first and second data lines when said gating device has said first switching state and wherein the driving of said differential potentials is inhibited when said gating device has said second switching state, said gating device capable of attaining said second switching state when one of said first and second data lines has a potential equal to a trip point of said differential signal sensing circuit, said trip point determined by electrical characteristics of said differential signal sensing circuit.

2. The electronic device as specified in claim 1, further comprising a current source in serial connection with said second node and said gating device, wherein a potential on one of said first and second data lines is capable of being pulled toward said first potential to a substantially greater degree than a potential on a remaining one of said first and second data lines, said pulling effected when a respective one of said first and second switching devices is actuated, said respective one data line pulled toward said first potential through said current source and said gating device, said gating device terminating the pulling of said one data line toward said first potential by interrupting a current path between said first potential and said current source when the potential of said one data line is equal to said trip point of said differential signal sensing circuit.

3. The electronic device as specified in claim 2, comprising:

a) first and second cross-coupled transistors coupled at a common input terminal, wherein a signal at an output node of said second cross-coupled transistor provides a gate signal for said first switching device and said first cross-coupled transistor, and wherein a signal at an output node of said first cross-coupled transistor provides a gate signal for said second switching device and said second cross-coupled transistor;

b) first and second input/output lines accepting electronic information to be driven to said first and second data lines respectively, wherein said electronic information provides said differential potential;

c) a decode switching device interposed between each of said output nodes of said first and second cross-coupled transistors and a corresponding one of said first and second input/output lines;

d) equilibrate circuitry capable of providing an equilibrate potential to said output nodes of said first and second cross-coupled transistors, said first and second cross-coupled transistors in electrical communication alternately with said first and second input/output lines and said equilibrate circuitry, said equilibrate potential on said output nodes of said first and second cross-coupled transistors providing a signal for deactuating said first and second switching devices;

e) a third switching device electrically interposed between a third node connectable to a second potential and said common input terminal, said third switching device, when activated, allowing said output nodes of said first and second cross-coupled transistors to be pulled to said equilibrate potential, and when said decode switching devices are actuated allowing said output nodes of said first and second cross-coupled transistors to be pulled to said differential potentials, said differential potentials amplified at said output nodes of said first and second cross-coupled transistors, said differential potentials, on said output nodes, providing a signal to actuate one of said first and second switching devices while providing a signal to deactuate the remaining one of said first and second switching devices in order to allow said first and second data lines to attain said differential potentials.

4. The electronic device as specified in claim 3, further comprising a timing enable signal for enabling said differential signal sensing circuit by activating said third switching device and said current source.

5. The electronic device a specified in claim 4, wherein said differential signal sensing circuit further comprises two cross-coupled logic gates, a first logic gate having first, second, and third input terminals and a second logic gate having first and second input terminals, said first and second input terminals of said first logic gate in electrical communication with said first and second data lines respectively and said third input terminal in electrical communication with an output terminal of said second logic gate, said first input of said second logic gate in electrical communication with an output of said first logic gate, and said second input of said second logic gate accepting said timing enable signal, said output terminal of said second logic gate being said output terminal of said differential signal sensing circuit.

6. A method for driving differential potentials to data lines comprising:

a) providing the differential potentials at input/output lines;

b) equilibrating transfer nodes to an equilibrate potential;

c) isolating said transfer nodes from said equilibrate potential;

d) allowing said transfer nodes to attain the differential potentials from said input/output lines;

e) driving said differential potentials to said data lines in response to said differential potentials on said transfer nodes;

f) sensing said differential potentials on the data lines with a sense circuit;

g) actuating a gating device with an output from said sense circuit;

h) deactuating said gating device when a potential on one of said data lines has a potential equal to a trip point of said sense circuit; and i) interrupting a current flow at at least one of said data lines in response to said deactuating thereby terminating the driving of said differential potentials to said data lines.

7. The method as specified in claim 6, wherein said step of driving further comprises:

a) enabling helper circuitry to facilitate a development of the differential potentials on said transfer nodes;

b) actuating a current source;

c) providing opposite gating signals to first and second driver transistors with said differential potentials on said transfer nodes, such that one of said driver transistors is actuated and the remaining one of said driver transistors is deactuated; and d) pulling the data line in electrical communication with the actuated driver transistor to a potential equal to said trip point through said actuated gating device and said actuated current source.

8. A memory circuit for driving a potential to a first data line, and for determining a logic state of the potential on the first data line from a potential on a first information line, and for driving a potential to a second data line, and for determining a logic state of the potential on the second data line by a potential on a second information line, the circuit comprising:

a) a reference node connectable to a reference potential;

b) a current source electrically interposed between said reference node and a junction node;

c) a first switching device electrically interposed between said first data line and said junction node;

d) a second switching device electrically interposed between said second data line and said junction node;

e) a helper flip flop electrically interposed said reference node and said first and said second information lines, said helper flip flop having a first control node in electrical communication with said first information line and having a second control node in electrical communication with said second information line, a potential on said first control node controlling an activation and deactivation of said second switching device, and a potential on said second control node controlling an activation and deactivation of said first switching device, said helper flip flop increasing a differential potential existing between said first and said second information lines such that in a first case said first control node has potential having a value which activates said second switching device and such that said second control node has a potential having a value which deactivates said first switching device, wherein said first data line is isolated from said current source by a deactivated said first switching device, such that in a second case said second control node has a potential having a value which activates said first switching device and such that said first control node has a potential having a value which deactivates said second switching device, wherein said second data line is isolated from said current source by a deactivated said second switching device;

f) a control latch circuit having a first and a second input node and having an output node, said first input node in electrical communication with said first data line and said second input node in electrical communication with said second data line, said control latch having a trip point, said trip point equal to a potential which alters a logic state of a potential at said output node; and g) a terminating device, having a control input in electrical communication with said output node, said terminating device electrically interposed between said junction node and said reference node and in electrical communication with said current source, said control latch circuit generating an output signal at said output node for activating said terminating device during a separation of potentials on said first and second data lines and in response to said potentials on said first and said second data line is pulled toward said reference potential through said current source, said second switching device and said terminating device, said control latch circuit generating a terminating signal for deactivating said terminating device when said second data line reaches a potential equal to said trip point of said control latch circuit, and wherein in said second case said first data line is pulled toward said reference potential through said current source, said first switching device and said terminating device, said control latch circuit generating a terminating signal for deactivating said terminating device when said first data line reaches a potential equal to said trip point of said control latch circuit, said separation of potentials ceasing in response to said terminating signal deactivating said terminating device such that a differential potential between said first and said second data lines is limited to a maximum value equal to a difference in said potential on said first data line and said potential of said trip point in said first case, and equal to a difference in said potential on said second data line and said potential of said trip point in said second case.

9. A method for limiting a differential potential between a first data line and a second data line, the method comprising the following steps:

a) driving a potential of the first data line toward a potential having a first logic state, said first logic state determined from a potential of a first information line;

b) driving a potential of the second data line toward a potential having a second logic state, said second logic state determined from a potential of a second information line;

c) monitoring said potentials on the first and the second data lines;

d) generating a terminating signal in response to one of said potentials of said first and said second data lines reaching a critical potential; and e) terminating said step of driving said potential of said one of said first and said second data lines having said critical potential thereby limiting the differential potential between said first and said second data lines to a maximum value.

10. A method for driving a first data line to a first potential and a second data line to a second potential such that a differential potential exists between the first and the second data lines, comprising the following steps:

a) precharging the first and the second data lines to a data line precharge potential;

b) precharging the first and second information lines to an information line precharge potential;
c) releasing the data line precharge potential in order to allow said first data line to attain said first potential and in order to allow said second data line to attain said second potential;
d) releasing the information line precharge potential in order to allow the first and the second information lines to attain potentials other than said information precharge potential;
e) developing a differential potential between a first I/O potential on the first information line and a second I/O potential on the second information line;
f) coupling said first I/O potential to a first control node;
g) coupling said second I/O potential to a second control node;
h) increasing a differential potential between said first and said second control nodes;
i) discharging the potential of said second data line through a discharge source to decrease a potential on said second data line in response to the potential on said first control node;
j) prohibiting said first data line from discharging in response to the potential on said second control node;
k) coupling said first data line to a potential having a logic state of a potential of said first information line;
l) monitoring the first and second data line potentials;
m) isolating said second data line from said discharge source in response to the potential of said second data line reaching a critical value; and
n) terminating said step of discharging said second data line in response to said step of isolating thereby limiting the differential potential between said first and said second data lines to a maximum value.

11. A memory circuit, comprising:
a) a first data line for accepting data;
b) a first switching device in electrical communication with said first data line;
c) a second data line for accepting a complement of the data;
d) a second switching device in electrical communication with said second data line;
e) a coupling node coupling said first and said second switching devices;
f) a third switching device interposed between said coupling node and a reference node, said reference node capable of connection to an electrical potential, said first data line driven to said electrical potential of said reference node through said first switching device and said third switching device, and said second data line driven to said electrical potential of said reference node through said second switching device and said third switching device; and
g) a sensing and termination circuit in electrical communication with said first data line, said second data line, and a control input of said third switching device, said sensing and termination circuit sensing a value of a potential on said first data line and sensing a value of a potential on said second data line, said sensing and termination circuit generating a termination signal to said control input of said third switching device when one of said values reaches a trip point potential of said sensing and termination circuit, said termination signal deactuating said third switching device to electrically isolate said coupling node from said reference node thereby terminating the driving of said electrical potential of said reference node to one of said first and second data lines.

* * * * *